(12) United States Patent
Lee et al.

(10) Patent No.: US 7,928,440 B2
(45) Date of Patent: Apr. 19, 2011

(54) DISPLAY SUBSTRATE, METHOD FOR MANUFACTURING THE DISPLAY SUBSTRATE AND DISPLAY APPARATUS HAVING THE DISPLAY SUBSTRATE

(75) Inventors: Woo-Geun Lee, Yongin-si (KR); Jae-Hyoung Youn, Seoul (KR); Ki-Won Kim, Suwon-si (KR); Jong-In Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 106 days.

(21) Appl. No.: 12/332,117

(22) Filed: Dec. 10, 2008

(65) Prior Publication Data
US 2009/0184326 A1   Jul. 23, 2009

(30) Foreign Application Priority Data
Jan. 22, 2008   (KR) .................. 10-2008-0006677

(51) Int. Cl.
*H01L 29/04* (2006.01)
*H01L 29/15* (2006.01)
*H01L 27/12* (2006.01)

(52) U.S. Cl. ...... 257/59; 257/72; 257/350; 257/E29.151

(58) Field of Classification Search .................. 257/59, 257/72, 350, E29.151
See application file for complete search history.

(56) References Cited

U.S. PATENT DOCUMENTS
| 2006/0110580 A1* | 5/2006 | Aylward et al. ............... 428/172 |
| 2007/0170855 A1* | 7/2007 | Choi et al. ..................... 313/512 |
| 2009/0027604 A1* | 1/2009 | Guo et al. ...................... 349/138 |

FOREIGN PATENT DOCUMENTS
| KR | 1020020034271 A | 5/2002 |
| KR | 1020030021744 A | 3/2003 |
| KR | 1020040011158 A | 2/2004 |

* cited by examiner

*Primary Examiner* — Ngan Ngo
(74) *Attorney, Agent, or Firm* — Innovation Counsel LLP

(57) ABSTRACT

A display substrate includes a base substrate, a gate line, a gate insulation layer, a data line, a thin-film transistor (TFT) and a pixel electrode. The gate line is extended in a first direction on the base substrate. The gate insulation layer is formed on the base substrate to cover the gate line. The data line is extended in a second direction and intersects the gate line at an intersecting portion. At the intersecting portion, the data line is separated from the gate line by an air gap. In another embodiment, the data line also includes at least one etching hole extending to the air gap. The TFT is electrically connected to the data and the gate lines. The pixel electrode is electrically connected to the TFT.

9 Claims, 13 Drawing Sheets

US 7,928,440 B2

DISPLAY SUBSTRATE, METHOD FOR MANUFACTURING THE DISPLAY SUBSTRATE AND DISPLAY APPARATUS HAVING THE DISPLAY SUBSTRATE

CROSS-REFERENCE TO RELATED APPLICATIONS

The present application claims priority under 35 U.S.C. §119 to Korean patent Application No. 10-2008-6677, filed on Jan. 22, 2008 in the Korean Intellectual property Office (KIPO), the contents of which are herein incorporated by reference in their entirety.

BACKGROUND OF THE INVENTION

1. Field of the Invention

The present invention relates to a display substrate, a method of manufacturing the display substrate and a display apparatus having the display substrate. More particularly, the present invention relates to a display substrate, a method of manufacturing the display substrate and a display apparatus having the display substrate used for a liquid crystal display (LCD) device.

2. Description of the Related Art

Generally, a liquid crystal display (LCD) device includes an LCD panel that displays an image using light transmissivity and a backlight assembly that is disposed under the LCD panel and provides the LCD panel with light.

The LCD panel includes a first substrate, a second substrate facing the first substrate and a liquid crystal layer interposed between the first substrate and the second substrate. The first substrate includes gate lines extending in a first direction, data lines extending in a second direction intersecting the first direction thin-film transistors (TFTs) electrically connected to the gate lines and the data lines, and pixel electrodes electrically connected to the TFTs.

As the data lines and the gate lines intersect, an overlap capacitance is generated between the data lines and the gate lines, so that the load of the LCD panel is increased. Because gate signals applied to the gate lines or data signals applied to the data lines experience additional loads as high as the overlap capacitance, the gate and data signals may be delayed.

SUMMARY OF THE INVENTION

The present invention provides a display substrate capable of decreasing an overlap capacitance.

The present invention also provides a method of manufacturing the display substrate.

The present invention also provides a display device having the display substrate.

According to an aspect of the present invention, a display substrate includes a base substrate, a gate line, a gate insulation layer, a data line, a thin-film transistor (TFT) and a pixel electrode.

The gate line is extended in a first direction on the base substrate. The gate insulation layer is formed on the base substrate to cover the gate line. The data line extends in a second direction intersecting the gate line extending in the first direction at an intersecting portion on the base substrate. In the intersecting portion, the data line is separated from the gate line by an air gap. In another embodiment, the data line includes at least one etching hole extending to the air gap. The TFT is electrically connected to the data and gate lines. The pixel electrode is electrically connected to the TFT.

The etching hole may be substantially formed on the center of the intersecting portion between the data line and the gate line.

The air gap may be formed between the data line and a portion of the gate line exposed by the gate insulation layer. The air gap may be formed between the data line and the gate insulation layer.

The display substrate may further include an insulation pattern of the intersecting portion formed between the data line and the air gap. The insulation pattern of the intersecting portion may be formed from a semiconductor pattern of the TFT.

The display substrate may further include a passivation film formed on the gate insulation layer to cover the data line and the TFT and to expose a portion of the data line corresponding to the air gap.

The display substrate may further include an organic insulation layer formed on the passivation film to expose the portion of the data line exposed by the passivation film.

In another aspect of the present invention, a method of manufacturing a display substrate is provided as follows. A gate line is formed on the base substrate. A gate insulation layer is formed on the base substrate to cover the gate line. A data line is formed on the gate insulation layer intersecting the gate line. A TFT electrically connected to the data and gate lines is formed. An air gap between the gate line and the data line is formed at an intersecting portion between the data line and the gate line. A pixel electrode electrically connected to the TFT is formed.

The air gap may be generated by etching a portion of the gate insulation layer that is formed between the data line and the gate line using an etching solution. The etching solution may include a hydrogen fluoride solution.

The portion of the gate insulation layer may be etched using the etching solution that is applied through an etching hole of the data line.

A passivation film may be formed on the gate insulation layer to cover the data line and the TFT. The air gap may further include etching a portion of the passivation film using the etching solution. When the portion of the passivation film is etched, a contact hole may be formed on the passivation film to electrically connect the pixel electrode to a portion of the TFT.

An organic insulation layer may be formed on the passivation film. When the air gap is formed, a portion of the organic insulation layer may be etched to expose the intersecting portion between the data line and the gate line, and then a portion of the passivation film is exposed by the organic insulation layer through the etching solution may be etched.

Before the gate insulation layer is formed, a sacrificial pattern may be formed on the gate insulation layer corresponding to the intersecting portion between the data line and the gate line. The air gap may be generated by etching the sacrificial pattern using an etching solution. The sacrificial pattern may include organic or inorganic matter that has an etch rate higher than that of the gate insulation layer using the etching solution.

In still another aspect of the present invention, a display device includes a first substrate, a second substrate facing the first substrate and a liquid crystal layer between the first substrate and the second substrate.

The first substrate includes a base substrate, a gate line, a gate insulation layer, a data line, a TFT and a pixel electrode. The gate line is extended in a first direction on the base substrate. The gate insulation layer is formed on the base substrate to cover the gate line. The data line extends in a second direction intersecting the gate line extending in the first direction at an intersecting portion on the base substrate. In the intersecting portion, the data line is separated from the gate line by an air gap. In another embodiment, the data line includes at least one etching hole extending to the air gap. The TFT is electrically connected to the data and gate lines. The pixel electrode is electrically connected to the TFT. According to the present invention as described above, as an air gap is formed between a gate line and a data line, an overlap capacitance generated between the gate line and the data line may be decreased and signal delays may be decreased.

BRIEF DESCRIPTION OF THE DRAWINGS

The above and other advantages of the present invention will become more apparent from the following detailed embodiments thereof with reference to the accompanying drawings, in which.

DESCRIPTION OF THE EMBODIMENTS

Figure 1:
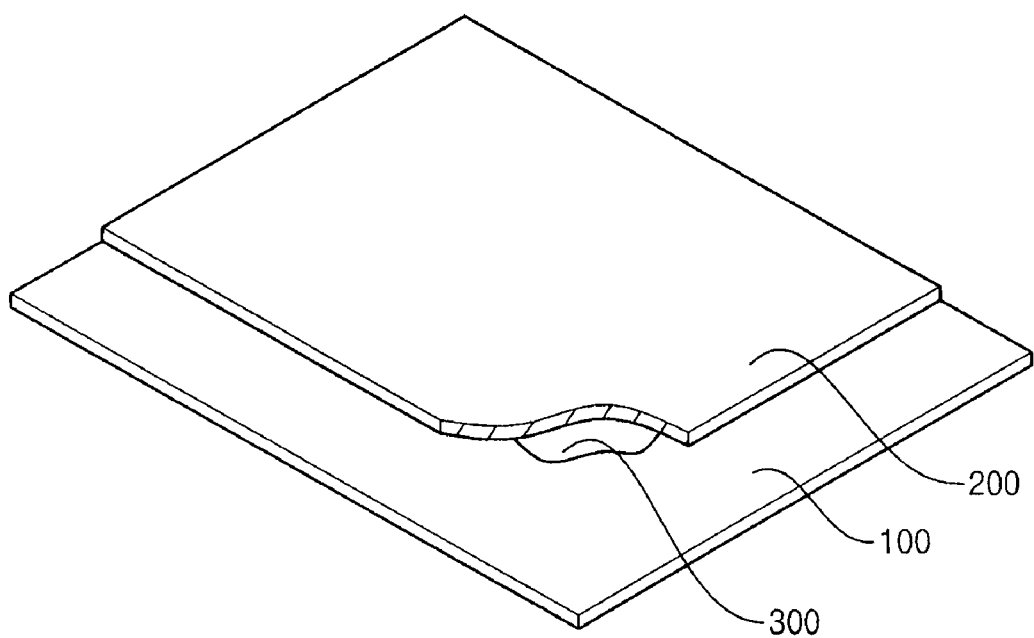
FIG. 1 is a perspective view illustrating a display device according to an embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or one feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a perspective view illustrating a display device according to an embodiment of the present invention.

Referring to FIG. 1, a display device includes a first substrate 100, a second substrate 200 and a liquid crystal layer 300, and displays an image using light.

For example, the first substrate 100 includes a plurality of pixel units that are arranged in a matrix.

The second substrate 200 is disposed facing the first substrate 100. The second substrate 200 may include color filters formed corresponding to the pixel units and a common electrode formed on the second substrate 200. For example, the color filters may include red color filters, green color filters and blue color filters. The color filters may be included in the first substrate 100 instead of the second substrate 200.

The liquid crystal layer 300 is disposed between the first substrate 100 and the second substrate 200. The arrangement of liquid crystals in the liquid crystal layer 300 is varied by an electric field formed between the pixel electrode and the common electrode. When the arrangement of the liquid crystals is varied, the light transmissivity of light transmitted through the liquid crystal is varied, and then an image is externally displayed.

The display device may further include a backlight assembly providing the light to the first substrate 100 from under the first substrate 100.

Figure 2:
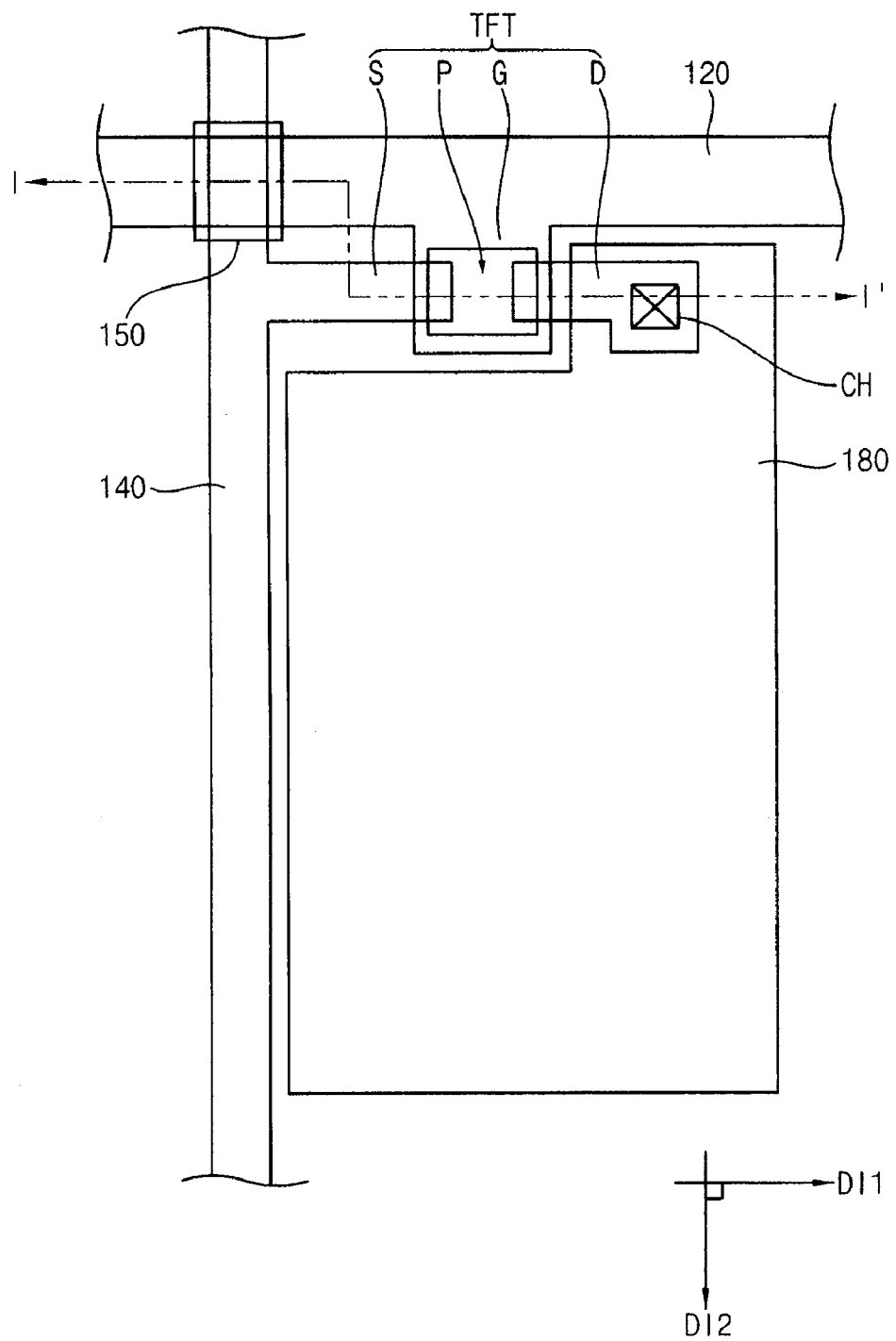
FIG. 2 is a plan view illustrating an enlarged pixel unit of the first substrate of the display device in FIG. 1.
Figure 3:
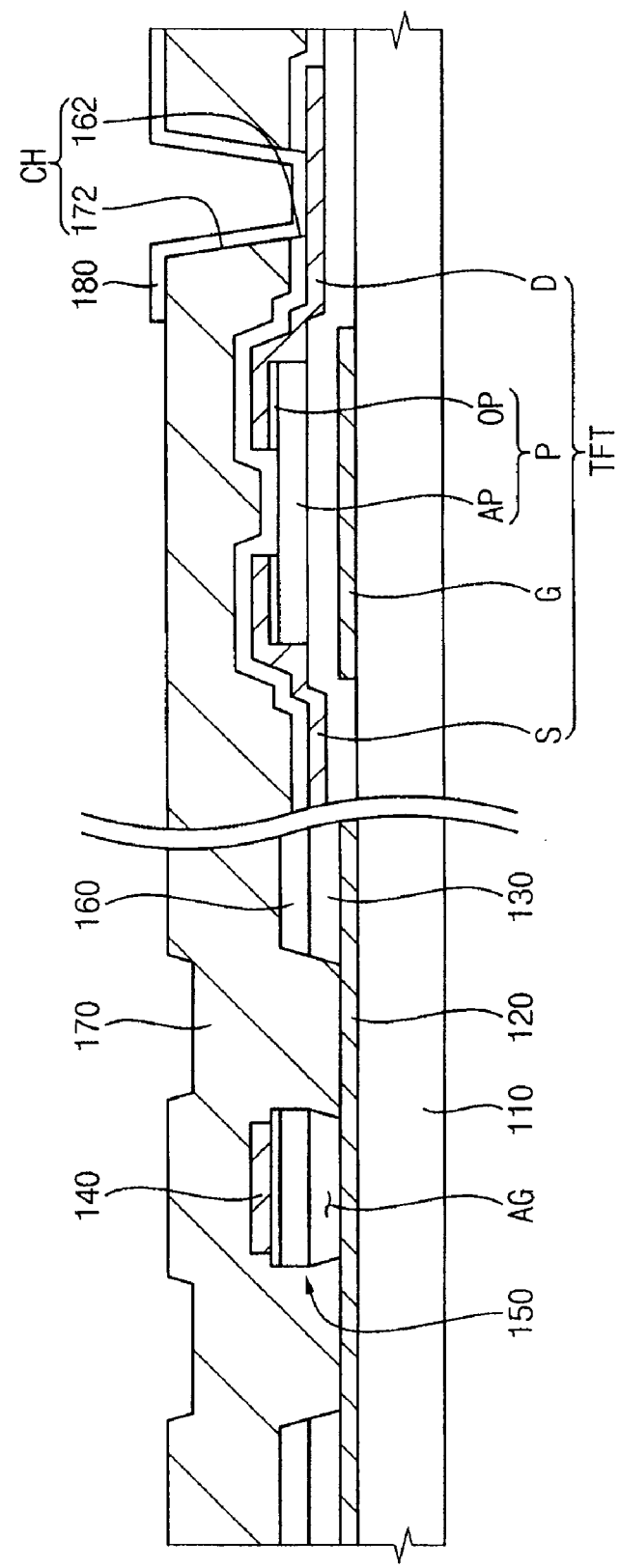
FIG. 3 is a cross-sectional view taken along a line I-I' shown in FIG. 2.

FIG. 2 is a plan view illustrating an enlarged pixel unit of the first substrate of the display device in FIG. 1. FIG. 3 is a cross-sectional view taken along a line I-I' shown in FIG. 2.

Referring to FIGS. 2 and 3, the first substrate 100 may include a base substrate 110, gate lines 120, a gate insulation layer 130, data lines 140, insulation patterns 150 of intersecting portions, thin-film transistors (TFTs), a passivation film 160, an organic insulation layer 170 and pixel electrodes 180.

The base substrate 110 has a plate shape. The base substrate 110 may include a transparent material such as glass, quartz, or a synthetic resin.

The gate lines 120 are formed on the base substrate 110. The gate lines 120 extend in parallel in a first direction DI1 and are arranged perpendicular to a second direction DI2. The first direction DI1 may intersect the second direction DI2. Each of the gate lines 120 may include Aluminum (Al), Copper (Cu) or Molybdenum (Mo).

The gate insulation layer 130 is formed on the base substrate 110 to cover the gate lines 120. The gate insulation layer 130 may include Silicon Nitride (SiNx), Silicon Oxide (SiOx), etc.

The data lines 140 are formed on the base substrate 110. The data lines 140 extend in parallel in a second direction DI2 and are arranged perpendicular to the first direction DI1. The data lines 140 may include Copper (Cu), Molybdenum (Mo), Molybdenum Tungsten (MoW), Chromium (Cr), Tantalum (Ta), Titanium (Ti), and so on.

The gate insulation layer 130 is not formed at intersecting portions between the gate lines 120 and the data lines 140. That is, the gate insulation layer 130 does not cover a portion of the gate lines 120 corresponding to the intersecting portions between the gate lines 120 and the data lines 140. The gate insulation layer 130 may not be formed on extended portions of the intersecting portions.

As the gate insulation layer 130 is not formed at the intersecting portions, air gaps AG are formed by the processes explained below on each of the intersecting portions between the gate lines 120 and the data lines 140. The air gaps AG are formed between the gate lines 120 and the data lines 140. The air gaps AG have the lowest dielectric constant, that is, 1. Then, the air gaps AG may decrease the overlap capacitance that is generated between the gate lines 120 and the data lines 140.

The insulation patterns 150 of the intersecting portions are formed at the intersecting portions, respectively. The insulation patterns 150 of the intersecting portions are formed between the air gaps AG and the data lines 140, respectively. Then, the overlap capacitance that is generated between the gate lines 120 and the data lines 140 may be further decreased. In the present embodiment, the insulation patterns 150 of the intersecting portions may be omitted. Each of the TFTs includes a gate electrode G connected to the gate line 120, a semiconductor pattern p formed on the gate insulation layer 130 to overlap the gate electrode G, a source electrode S connected to the data line 140, and a drain electrode D separated from the source electrode S.

The gate electrode G protrudes from the gate line 120 and is formed on the base substrate 110. The gate electrode G is covered with the gate insulation layer 130. For example, the gate electrode G may be generated in a direction substantially parallel with the second direction DI2 by being protruded from the gate line 120. The gate electrode G may be a portion of the gate line 120.

The source electrode S protrudes from the data line 140 and is formed on the gate insulation layer 130. A portion of the source electrode S is formed on the semiconductor pattern p to overlap the semiconductor pattern p. For example, the source electrode S may be generated in a direction substantially parallel with the first direction DI1 by being protruded from the data line 140. The source electrode S may be a portion of the data line 140.

The drain electrode D is formed on the gate insulation layer 130, spaced apart from the source electrode S. A portion of the drain electrode D is formed on the semiconductor pattern p to overlap the semiconductor pattern p.

The semiconductor pattern p may include an active pattern Ap and an ohmic contact pattern Op. The active pattern Ap is formed on the gate insulation layer 130 to overlap the gate electrode G. For example, the active pattern Ap may include amorphous silicon or microcrystalline silicon. The ohmic contact pattern Op is formed between the source electrode S and the active pattern Ap, and is formed between the drain electrode D and the active pattern Ap. The ohmic contact pattern Op may decrease contact resistance between the source electrode S and the active pattern Ap, and decrease the contact resistance between the drain electrode D and the active pattern Ap. For example, the ohmic contact pattern Op may include high-density ion-implanted amorphous silicon or high-density ion-implanted microcrystalline silicon.

The insulation patterns 150 of the intersecting portions may be generated by a manufacturing process of the semiconductor pattern p. That is, the insulation patterns 150 of the intersecting portions may include substantially the same materials and structures as those of the semiconductor pattern p.

The passivation film 160 is formed on the gate insulation layer 130 to cover the data lines 140 and the TFTs. For example, the passivation film 160 may include Silicon Nitride (SiNx), Silicon Oxide (SiOx), etc.

The passivation film 160 does not cover a portion of the data lines 140 corresponding to the intersecting portions between the gate lines 120 and the data lines 140. That is, the passivation film 160 is not formed at the intersecting portions between the gate lines 120 and the data lines 140, however, it is formed on the gate insulation layer 130. Then, the passivation film 160 may expose the portion of the gate lines 120 that is exposed by the gate insulation layer 130.

The organic insulation layer 170 is formed on the passivation film 160. For example, the organic insulation layer 170 may have a thickness greater than about 2 µm. An upper surface of the organic insulation layer 170 may be substantially parallel with the base substrate 110.

The organic insulation layer 170 may cover the portion of the gate lines 120 that is exposed by the gate insulation layer 130 and the passivation film 160. For example, the organic insulation layer 170 may cover the portion of the gate lines 120 that is exposed by the gate insulation layer 130 and the passivation film 160 except for the intersecting portions between the gate lines 120 and the data lines 140. By the process explained below, the air gaps AG are formed between the gate lines 120 and the data lines 140. That is, the air gaps AG are formed between the gate lines 120 and the data lines 140 corresponding to the intersecting portions between the gate lines 120 and the data lines 140.

The pixel electrode 180 is formed in each of the pixel units. The pixel electrode 180 is connected to the drain electrode D of the TFT through contact holes CH formed on the organic insulation layer 170 and the passivation film 160. The pixel electrode 180 includes a transparent conductive material such as an Indium Tin Oxide, an Indium Zinc Oxide, and so on.

Each of the contact holes CH includes a first contact hole 162 that is formed on the passivation film 160 to expose a portion of the drain electrode D and a second contact hole 172 that is formed on the organic insulation layer 170 to correspond to the first contact hole 162.

The first substrate 100 illustrated in FIGS. 2 and 3 is manufactured by a five-mask process; however, the first substrate 100 may be manufactured by a three-, five- or six-mask process.

Figure 4A:
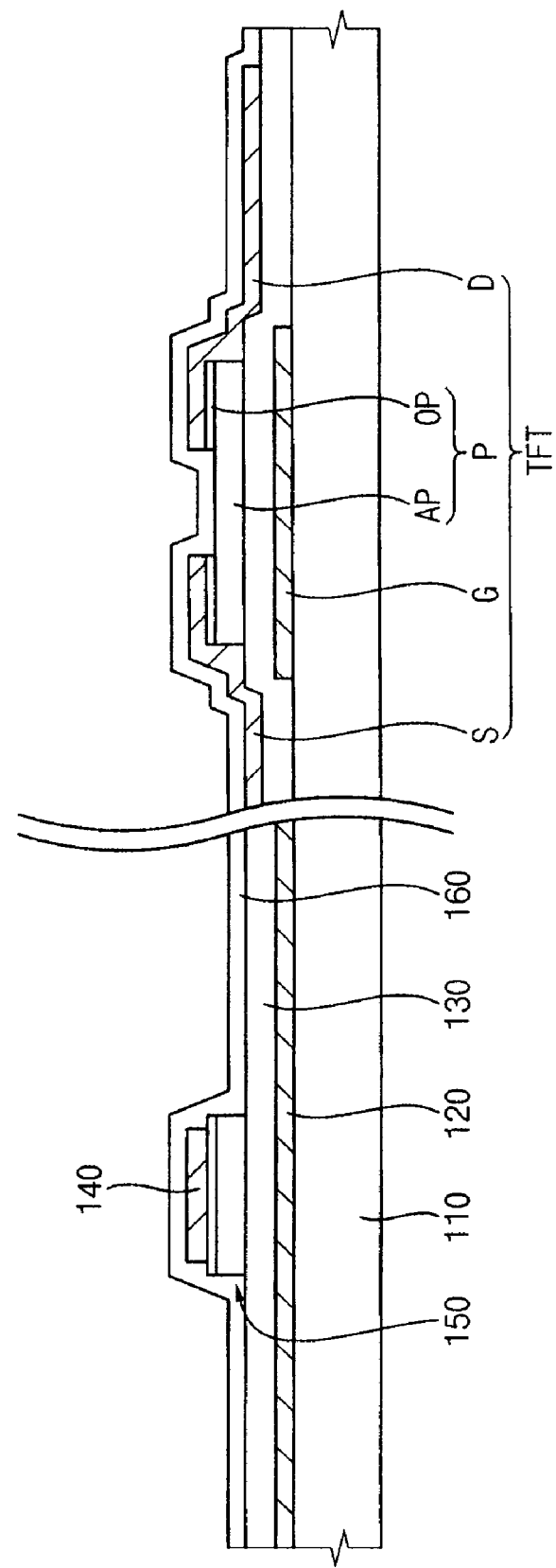
FIGS. 4A and 4B are cross-sectional views illustrating a method of manufacturing the first substrate in FIG. 3.
Figure 4B:
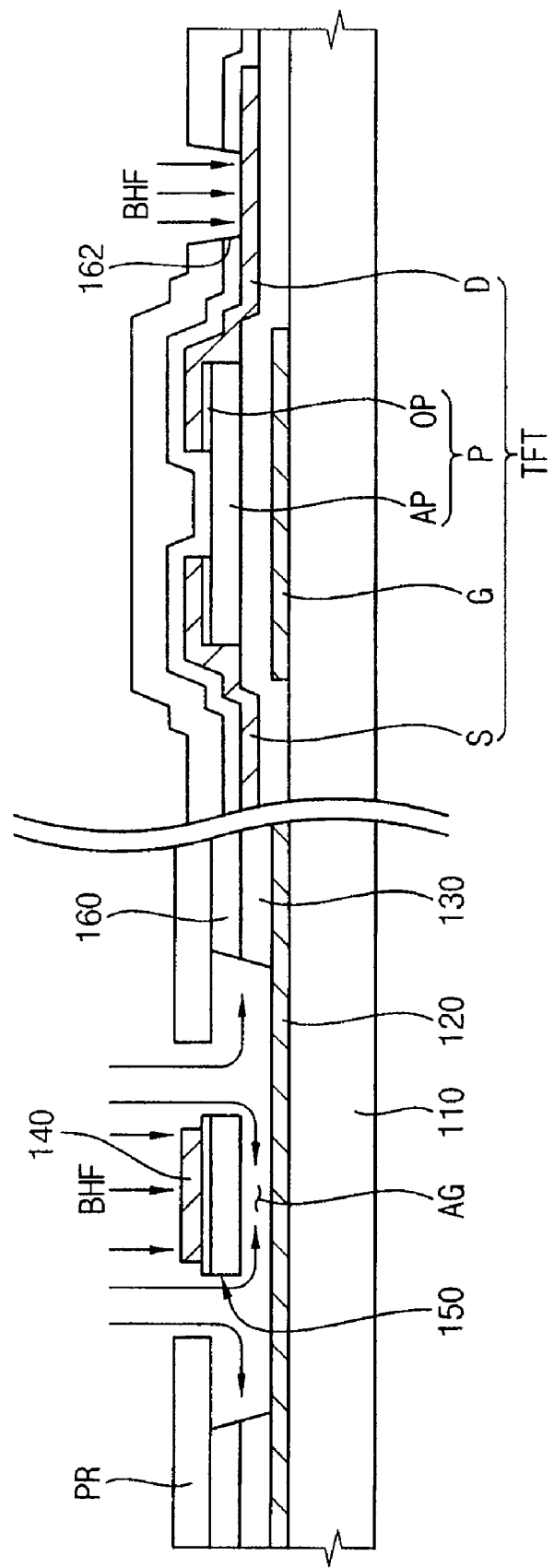

FIGS. 4A and 4B are cross-sectional views illustrating a method of manufacturing the first substrate in FIG. 3.

Referring to FIG. 4A, in the method of manufacturing the first substrate 100, the gate lines 120 and the gate electrode G are formed on the base substrate 110.

The gate insulation layer 130 is formed on the base substrate 110 to cover the gate lines 120 and the gate electrode G.

The semiconductor layer is formed on the gate insulation layer 130, and then the semiconductor pattern p and the insulation patterns 150 of the intersecting portions are formed by patterning the semiconductor layer. In the present embodiment, the insulation patterns 150 of the intersecting portions may not be formed. For example, the semiconductor layer is formed on the gate insulation layer 130 and may include the active pattern Ap including amorphous silicon or microcrystalline silicon and the ohmic contact pattern Op including high-density ion-implanted amorphous silicon or high-density ion-implanted microcrystalline silicon.

A metal layer is formed on the gate insulation layer 130 to cover the semiconductor pattern p and the insulation patterns 150 of the intersecting portions, and then the data lines 140, the source electrodes S and the drain electrodes D are formed by patterning the metal layer. A portion of the ohmic contact pattern Op is etched using the source electrodes S and the drain electrodes D as a mask.

The passivation film 160 is formed on the gate insulation layer 130 to cover the data lines 140 and the TFTs.

In the method of manufacturing the first substrate 100, the semiconductor layer is patterned and then the metal layer is patterned as described above. However, the metal layer may be patterned, and then the semiconductor layer may be patterned. The TFTs of the first substrate 100 may be manufactured by other processes.

Referring to FIG. 4B, the passivation film 160 is formed, a photoresist layer is formed on the passivation film 160, and then a photoresist pattern pR is formed by patterning the photoresist layer.

The photoresist pattern pR exposes the intersecting portions between the gate lines 120 and the data lines 140. The photoresist pattern pR may expose extended portions of the intersecting portions. The photoresist pattern pR exposes a portion of the passivation film 160 corresponding to the drain electrodes D of the TFTs.

A portion of the gate insulation layer 130 and a portion of the passivation film 160 corresponding to the intersecting portions between the gate lines 120 and the data lines 140 are etched using an etching solution such as buffered hydrofluoric acid (BHF). The etching solution may etch the portion of the passivation film 160 corresponding to the drain electrodes D, and then the first contact hole 162 is formed on the passivation film 160.

The etching solution is applied through openings of the photoresist pattern pR and etches the portion of the passivation film 160, so that the portion of the data lines 140 corresponding to the intersecting portions between the gate lines 120 and the data lines 140 is exposed.

The etching solution is applied to the gate insulation layer 130 through a path between the photoresist pattern pR and the data lines 140, so that the portion of the gate insulation layer 130 is etched. Then, the etching solution may be applied to a horizontal direction of the base substrate 110, so that a portion of the gate insulation layer 130 or a portion of the passivation film 160 may be etched. Thus, the air gaps AG may be formed between the gate lines 120 and the data lines 140. That is, the air gaps AG may be formed by etching the portion of the gate insulation layer 130 between the gate lines 120 and the data lines 140.

The etching solution may include a buffered hydrofluoric acid (BHF) solution. For example, the buffered hydrofluoric acid (BHF) solution may have a volume ratio of about 5% to about 15% of hydrogen fluoride to about 85% and to about 95% of distilled water. When the etching solution includes the buffered hydrofluoric acid (BHF) solution, the gate lines 120 and the data lines 140 may include Copper (Cu) or Molybdenum (Mo) that are etch resistant.

Referring again to FIG. 3, the portion of the passivation film 160 and the portion of the gate insulation layer 130 are etched using the etching solution, and then the photoresist pattern pR is etched.

The organic insulation layer 170 is formed on the passivation film 160. The organic insulation layer 170 may cover the portion of the gate lines 120 that is exposed by the gate insulation layer 130 and the passivation film 160. For example, the organic insulation layer 170 may cover the portion of the gate lines 120 that is exposed by the gate insulation layer 130 and the passivation film 160 except for the intersecting portions between the gate lines 120 and the data lines 140.

The second contact holes 172 are formed on the organic insulation layer 170 corresponding to the first contact holes 162, so that the portion of the drain electrodes D of the TFTs is exposed by the first and second contact holes 162 and 172.

The pixel electrodes 180 are formed on the organic insulation layer 170. The pixel electrodes 180 are respectively formed on the pixel units, and are electrically connected to a portion of the drain electrodes D through the first and second contact holes 162 and 172.

Figure 5:
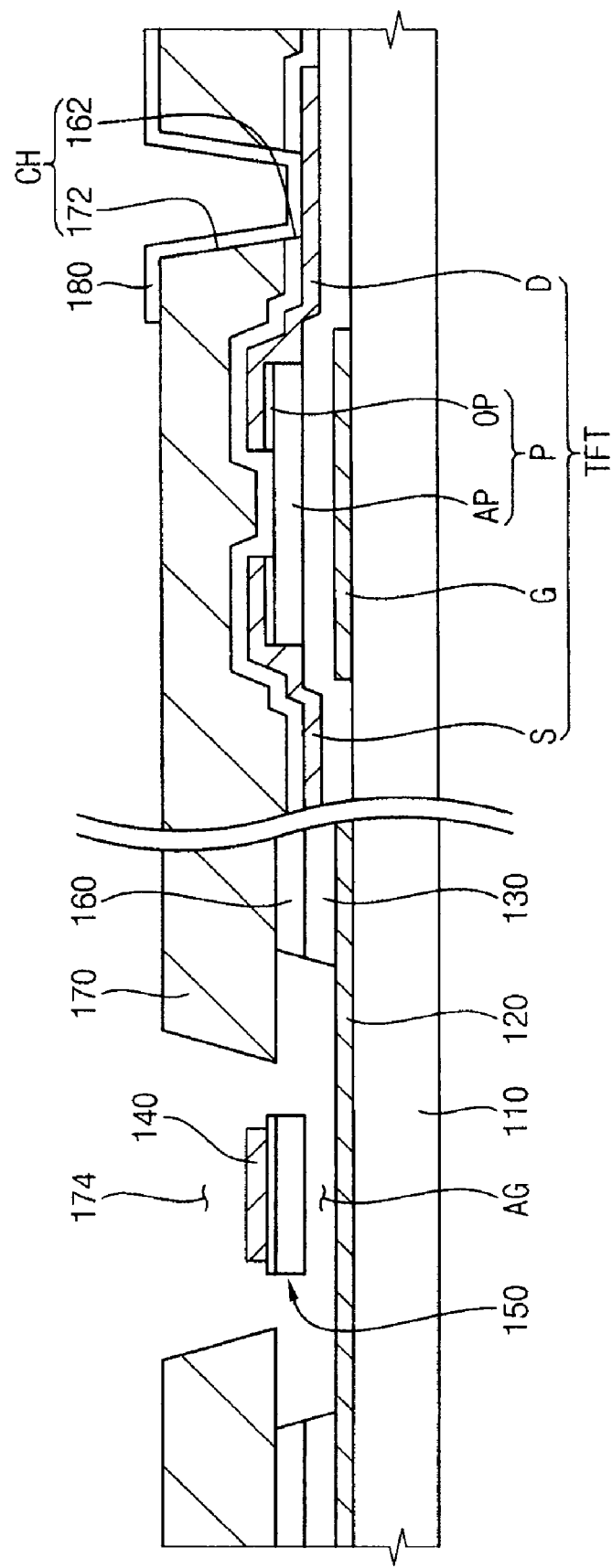
FIG. 5 is a cross-sectional view illustrating a first substrate of a display device according to another embodiment of the present invention.

FIG. 5 is a cross-sectional view illustrating a first substrate of a display device according to another embodiment of the present invention.

Referring to FIG. 5, because a first substrate in the present embodiment is substantially the same as the first substrate in FIG. 3 except for a portion of the organic insulation layer 170, detailed descriptions except for the portion of the organic insulation layer 170 are not required.

The openings 174 are formed on the organic insulation layer 170 corresponding to each of the intersecting portions between the gate lines 120 and the data lines 140 and expose a portion of the data lines 140.

A path may be formed by separating the organic insulation layer 170 and the data lines 140.

Spaces substantially the same as the air gaps AG may be formed between the portion of the gate lines 120 exposed by the passivation film 160 and the gate insulation layer 130, and the organic insulation layer 170.

Figure 6:
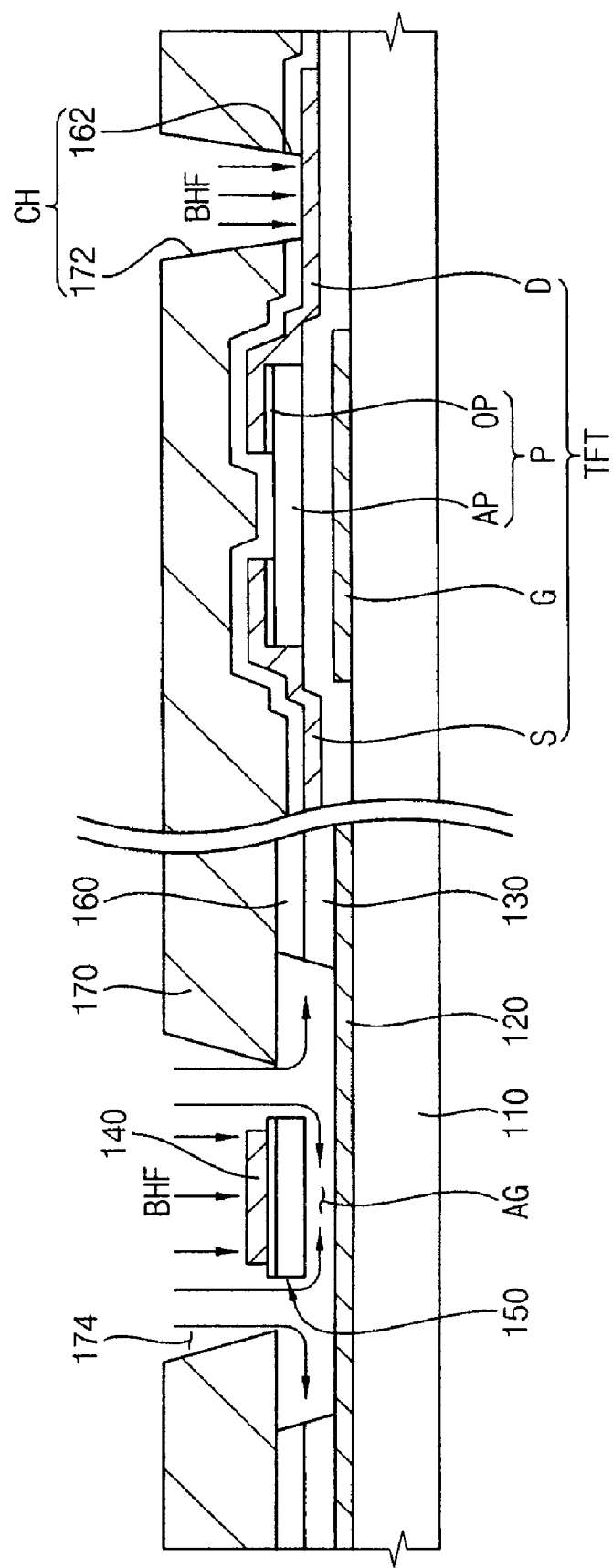
FIG. 6 is a cross-sectional view illustrating a method of manufacturing the first substrate in FIG. 5.

FIG. 6 is a cross-sectional view illustrating a method of manufacturing the first substrate in FIG. 5.

Referring to FIG. 6, in the method of manufacturing the first substrate according to the present embodiment, all of the steps until the step of forming the passivation film 160 are substantially the same as those of the method of manufacturing the first substrate described in FIGS. 3, 4A and 4B, and thus the steps until the process of manufacturing the passivation film 160 are not required.

The passivation film 160 is formed, and then the organic insulation layer 170 having the second contact holes 172 and the openings 174 is formed on the passivation film 160.

The second contact holes 172 are formed at locations which correspond to a portion of the drain electrodes D of the TFTs. The openings 174 are formed at locations which correspond to each of the intersecting portions between the gate lines 120 and the data lines 140.

The portion of the gate insulation layer 130 and the portion of the passivation film 160 corresponding to the intersecting portions between the gate lines 120 and the data lines 140 are etched using an etching solution that is applied through the openings 174 of the organic insulation layer 170. Also, the etching solution etches the portion of the passivation film 160 corresponding to the drain electrodes D of the TFTs through the second contact holes 172 of the organic insulation layer 170, and then the first contact hole 162 is formed on the passivation film 160.

The etching solution is applied through openings 174 of the organic insulation layer 170 and etches a portion of the passivation film 160. Thus, the portion of the data lines 140 corresponding to the intersecting portions between the gate lines 120 and the data lines 140 is exposed.

The etching solution is applied to the gate insulation layer 130 through a path between the organic insulation layer 170 and the data lines 140, so that the portion of the gate insulation layer 130 is etched. Then, the etching solution may be applied to a horizontal direction of the base substrate 110, so that a portion of the gate insulation layer 130 or a portion of the passivation film 160 may be etched. Thus, the air gaps AG are formed between the gate lines 120 and the data lines 140.

The etching solution may include a buffered hydrofluoric acid (BHF) solution. For example, the buffered hydrofluoric acid (BHF) solution may have a volume ratio of about 5% to 15% of hydrogen fluoride to about 85% and to about 95% of distilled water.

Referring again to FIG. 5, the portion of the passivation film 160 and the portion of the gate insulation layer 130 are etched, and then the pixel electrodes 180 are formed on the organic insulation layer 170. The pixel electrodes 180 are formed on the pixel units respectively and are electrically connected to a portion of the drain electrodes D through the first and second contact holes 162 and 172.

Figure 7:
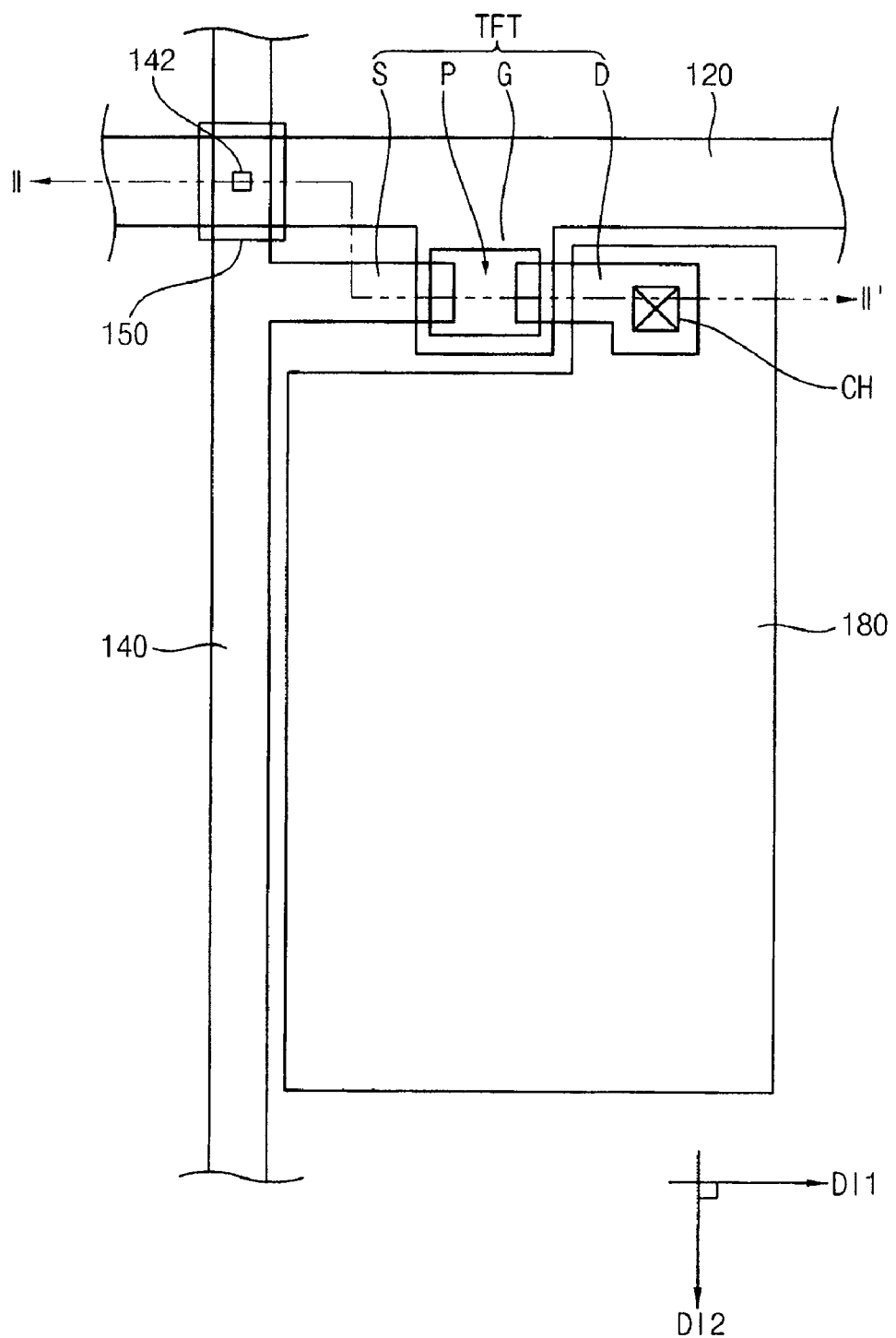
FIG. 7 is a plan view illustrating an enlarged pixel unit of a first substrate of a display device according to still another embodiment of the present invention.
Figure 8:
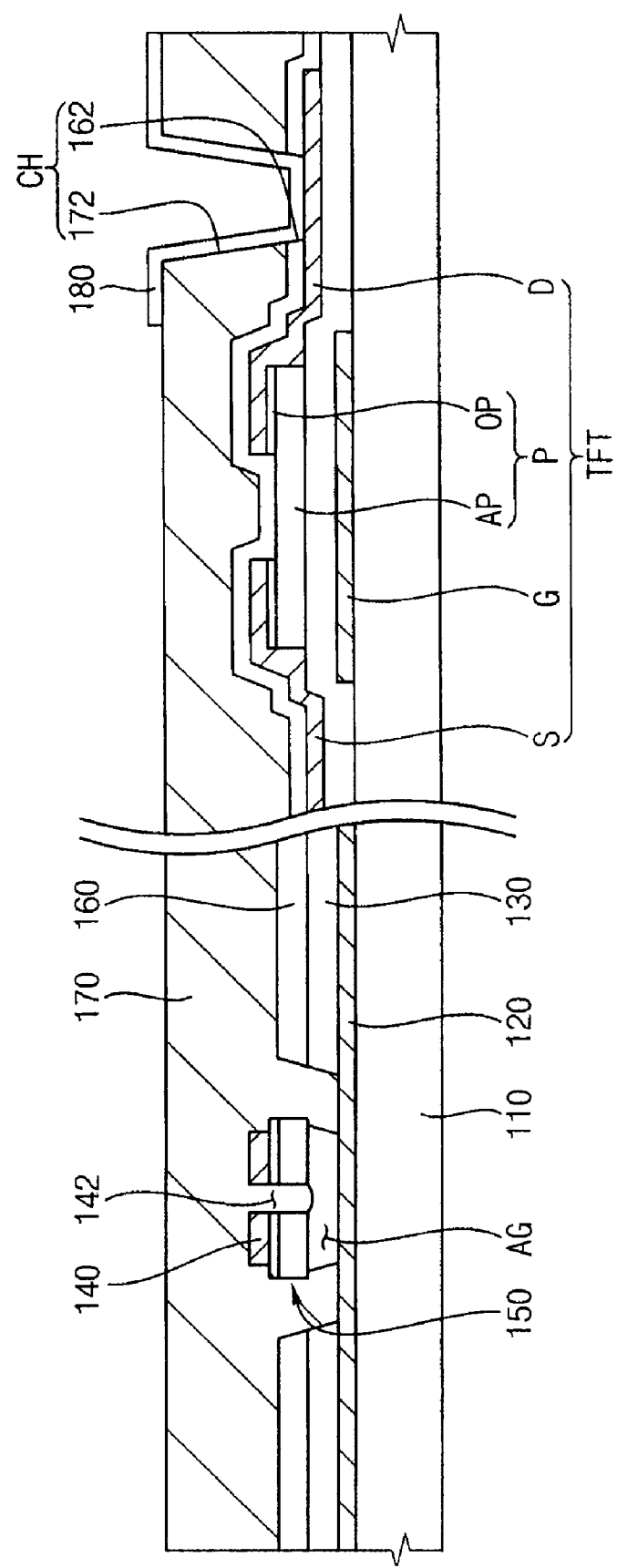
FIG. 8 is a cross-sectional view taken along a line II-II' shown in FIG. 7.

FIG. 7 is a plan view illustrating an enlarged pixel unit of a first substrate of a display device according to still another embodiment of the present invention. FIG. 8 is a cross-sectional view taken along a line 11-11' shown in FIG. 7.

Referring to FIGS. 7 and 8, because a first substrate in the present embodiment is substantially the same as the first substrate in FIG. 3 except for a portion of the data lines 140 and a portion of the insulation patterns 150 of the intersecting portions, detailed descriptions except for the portion of the data lines 140 and the portion of the insulation patterns 150 of the intersecting portions will not be repeated.

The etching holes 142 are formed on the data lines 140 and the insulation patterns 150 of the intersecting portions corresponding to the intersecting portions between the gate lines 120 and the data lines 140, respectively. That is, at least one etching hole 142 is formed in the intersecting portion between the gate line 120 and the data line 140. The etching hole 142 may be formed at a location that corresponds to substantially the center of the intersecting portion between the gate line 120 and the data line 140. The etching holes 142 may be filled by the organic insulation layer 170.

In the present embodiment, when the insulation pattern 150 of the intersecting portion is omitted, the etching hole 142 may be formed on only the data lines 140. A plurality of the etching holes 142 may be formed in the intersecting portion between the gate line 120 and the data line 140 different from FIGS. 7 and 8. The plurality of the etching holes 142 may be separated from each other by a predetermined distance. For example, the plurality of the etching holes 142 may be disposed in a matrix in the intersecting portion between the gate line 120 and the data line 140.

The portion of the gate lines 120 exposed by the passivation film 160 and the gate insulation layer 130 may be decreased in size to be smaller than the portion of the gate lines 120 exposed by the passivation film 160 and the gate insulation layer 130 in FIG. 3.

Figure 9:
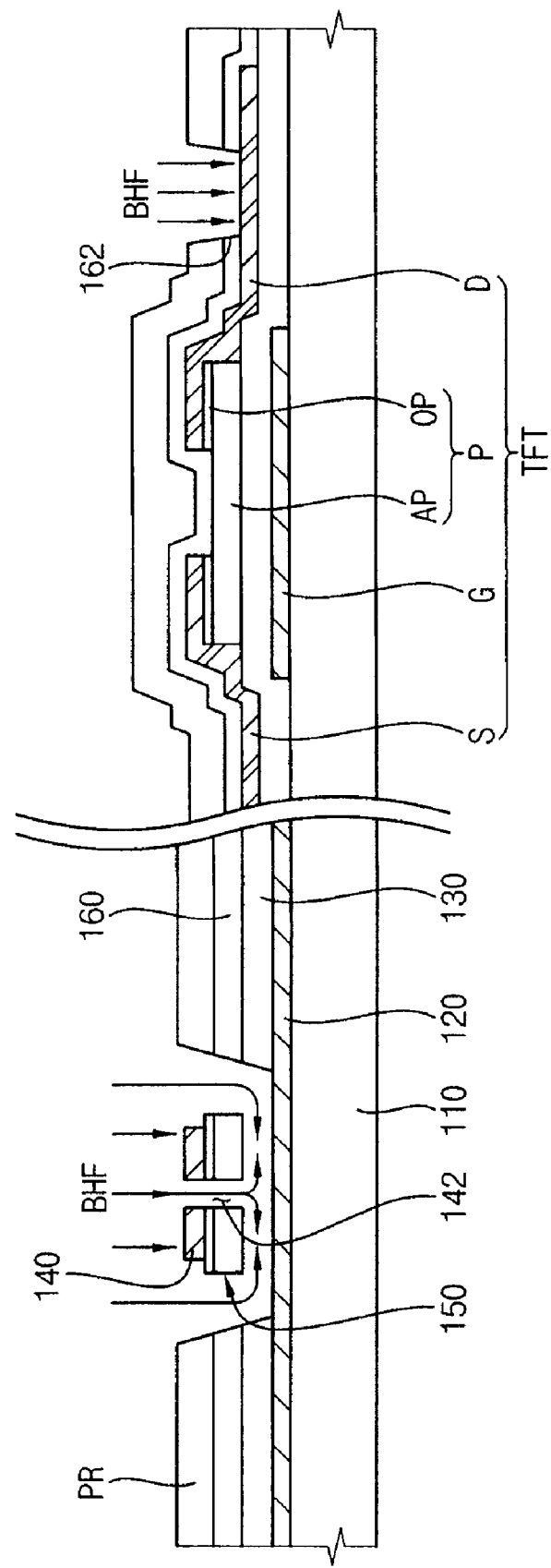
FIG. 9 is a cross-sectional view illustrating a method of manufacturing the first substrate in FIG. 8.

FIG. 9 is a cross-sectional view illustrating a method of manufacturing the first substrate in FIG. 8.

Referring to FIG. 9, in the method of manufacturing the first substrate according to the present embodiment, all of the steps until the step of forming the photoresist pattern pR are substantially the same as those in the method of manufacturing the first substrate described in FIGS. 3, 4A and 4B, and thus the steps until the process of manufacturing the photoresist pattern pR will not be repeated.

The photoresist pattern pR is formed, and then the gate lines 120, the portion of the passivation film 160 and the portion of the gate insulation layer 130 corresponding to the intersecting portions between the gate lines 120 and the data lines 140 are etched using an etching solution. Also, the etching solution etches a portion of the passivation film 160 corresponding to the drain electrodes D of the TFTs and then the first contact hole 162 is formed on the passivation film 160.

The etching solution is applied through openings of the photoresist pattern pR and etches a portion of the passivation film 160. Thus, the portion of the data lines 140 corresponding to the intersecting portions between the gate lines 120 and the data lines 140 is exposed.

The etching solution is applied to the gate insulation layer 130 through a path between the photoresist pattern pR and the data lines 140, and through the etching holes 142 formed on the insulation pattern 150 of the intersecting portion, so that a portion of the gate insulation layer 130 is etched. Thus, the air gaps AG are formed between the gate lines 120 and the data lines 140. That is, the air gaps AG are formed between the insulation pattern 150 of the intersecting portion and the gate lines 120 by etching the gate insulation layer 130.

As the etching solution is applied through the etching holes 142 and etches the portion of the gate insulation layer 130, etching of extended portions of the intersecting portions between the gate lines 120 and the data lines 140 may be prevented. Thus, the portion of the gate lines 120 exposed by the passivation film 160 and the gate insulation layer 130 may be minimized.

The etching solution may include a buffered hydrofluoric acid (BHF) solution. For example, the buffered hydrofluoric acid (BHF) solution may have a volume ratio of about 5% to about 15% of hydrogen fluoride to 85% and to 95% of distilled water.

Referring again to FIG. 8, the portion of the passivation film 160 and the portion of the gate insulation layer 130 are etched using the etching solution, and then the photoresist pattern pR is etched.

The organic insulation layer 170 is formed on the passivation film 160. The organic insulation layer 170 may cover the portion of the gate lines 120 that is exposed by the gate insulation layer 130 and the passivation film 160.

The second contact holes 172 are formed on the organic insulation layer 170 corresponding to the first contact holes 162, so that the portion of the drain electrodes D of the TFTs is exposed by the first and second contact holes 162 and 172.

The pixel electrodes 180 are formed on the organic insulation layer 170. The pixel electrodes 180 are formed on the pixel units respectively and are electrically connected to a portion of the drain electrodes D through the first and second contact holes 162 and 172.

Figure 10:
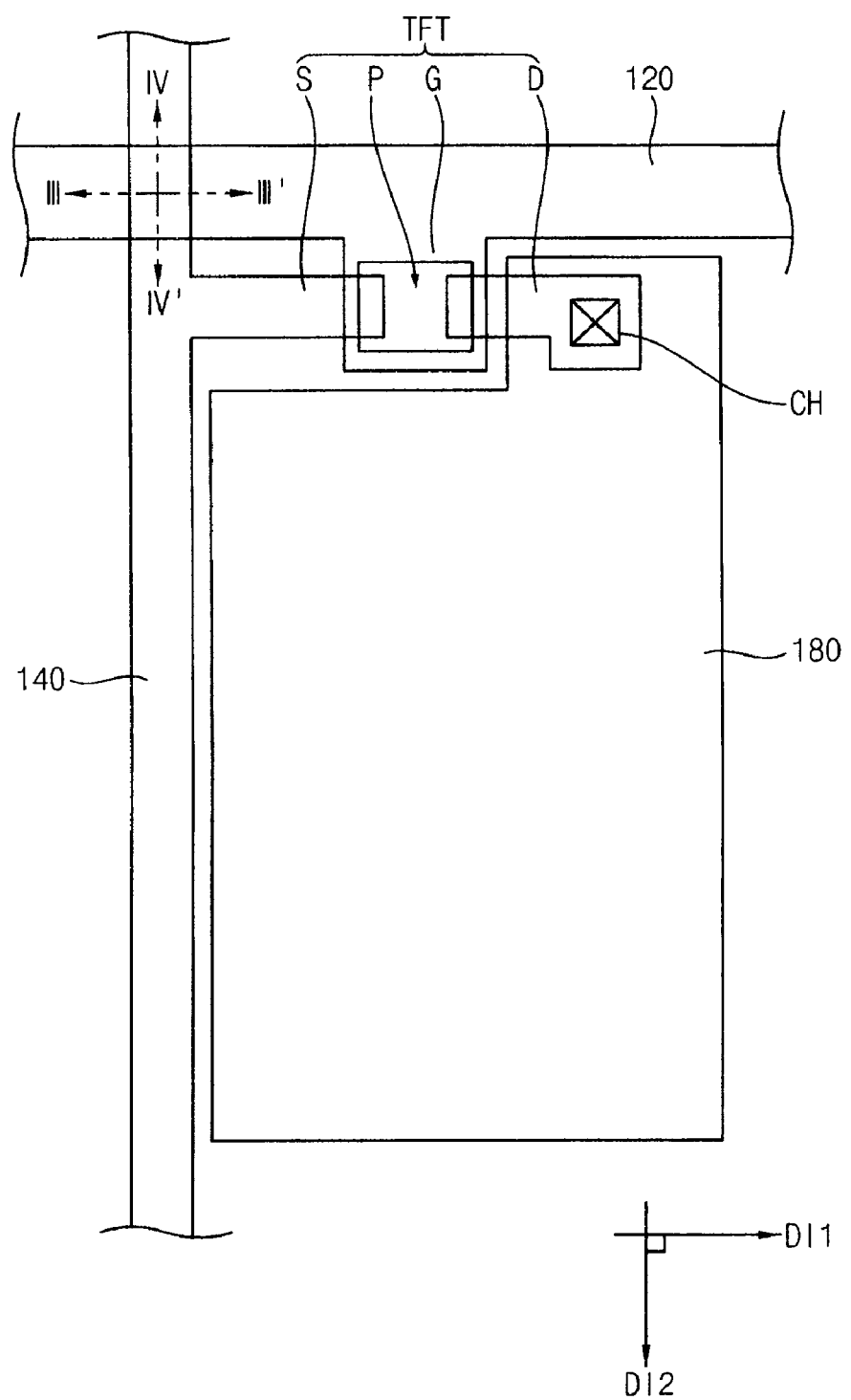
FIG. 10 is a plan view illustrating an enlarged pixel unit of a first substrate of a display device according to further still another embodiment of the present invention.
Figure 11:
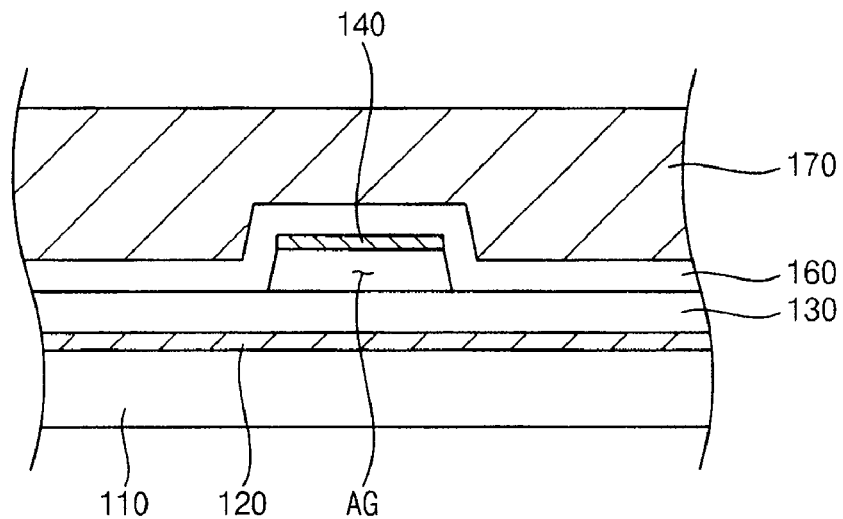
FIG. 11 is a cross-sectional view taken along a line III-III' shown in FIG. 10.
Figure 12:
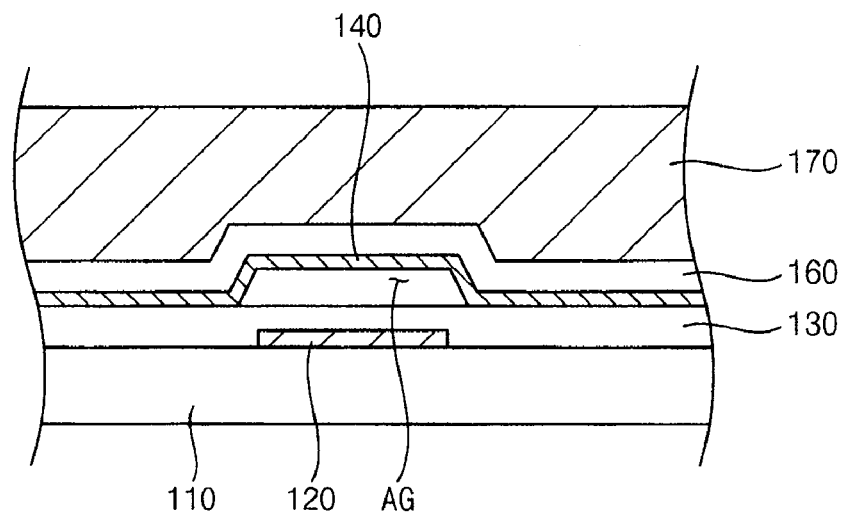
FIG. 12 is a cross-sectional view taken along a line IV-IV' shown in FIG. 10.

FIG. 10 is a plan view illustrating an enlarged pixel unit of a first substrate of a display device according to further still another embodiment of the present invention. FIG. 11 is a cross-sectional view taken along a line III-III' shown in FIG. 10. FIG. 12 is a cross-sectional view taken along a line IV-IV' shown in FIG. 10.

Referring to FIGS. 10, 11 and 12, because a first substrate in the present embodiment is substantially the same as the first substrate in FIG. 3 except for the intersecting portions between the gate lines 120 and the data lines 140, detailed descriptions except for the intersecting portions between the gate lines 120 and the data lines 140 will not be repeated.

The data lines 140 are curved upwardly at the gate insulation layer 130 corresponding to the intersecting portions between the gate lines 120 and the data lines 140. Thus, the air gaps AG are formed between the gate insulation layer 130 covering the gate lines 120 and the data lines 140. That is, the air gaps AG are formed between the gate lines 120 and the data lines 140 at the intersecting portions between the gate lines 120 and the data lines 140.

Figure 13A:
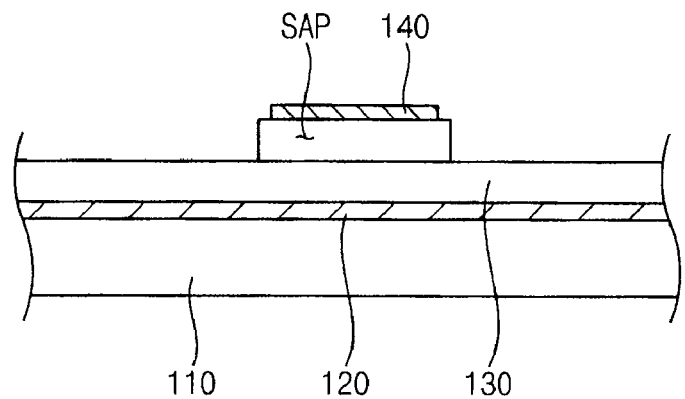
FIGS. 13A and 13B are cross-sectional views illustrating a method of manufacturing the first substrate in FIG. 11.
Figure 13B:
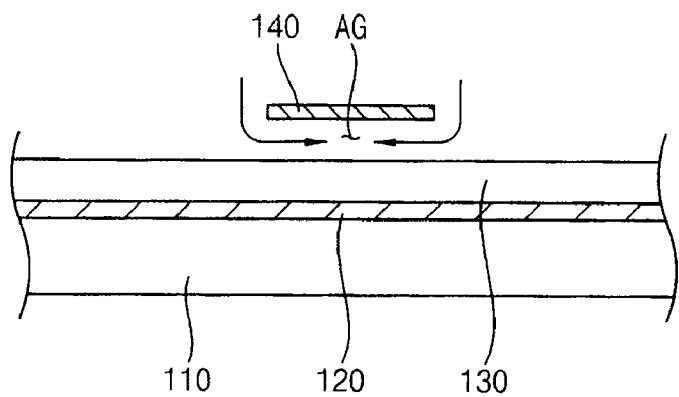

FIGS. 13A and 13B are cross-sectional views illustrating a method of manufacturing the first substrate in FIG. 11.

Referring to FIGS. 4A and 13A, in the method of manufacturing the first substrate according to the present embodiment, the gate lines 120 and the gate electrodes G are formed.

The gate insulation layer 130 is formed on the base substrate 110 to cover the gate lines 120 and the gate electrodes G.

The semiconductor layer is formed on the gate insulation layer 130, and then the semiconductor patterns p are formed by patterning the semiconductor layer. Also, a sacrificial layer is formed on the gate insulation layer 130, and the sacrificial patterns SAp are formed by patterning the sacrificial layer. The semiconductor patterns p may be formed, and then the sacrificial patterns SAp may be formed. However, the sacrificial patterns SAp may be formed, and then semiconductor patterns p may be formed.

A metal layer is formed on the gate insulation layer 130 to cover the sacrificial patterns SAp and the semiconductor patterns p, and then the data lines 140, the source electrodes S and the drain electrodes D are formed by patterning the metal layer.

Referring to FIGS. 4B and 13B, the metal layer is patterned and then the sacrificial patterns SAp is etched through an etching solution, so that air gaps AG are formed between the gate lines 120 and the data lines 140.

The sacrificial patterns SAp include organic or inorganic matter that has an etch rate higher than that of the gate insulation layer 130 using the etching solution. That is, the sacrificial patterns SAp are more etched than the gate insulation layer 130 using the etching solution. The gate insulation layer 130 may not be etched and only the sacrificial patterns SAp may be etched.

For example, the sacrificial patterns SAp may include a photoresist material or may include Silicon Nitride (SiNx), Silicon Oxide (SiOx), etc. that has a density lower than that of the gate insulation layer 130. The etching solution may include a buffered hydrofluoric acid (BHF) solution.

A portion of the ohmic contact pattern Op of the semiconductor patterns p is etched using the source electrodes S and the drain electrodes D as a mask. Here, the portion of the ohmic contact pattern Op may be etched, and then the sacrificial patterns SAp may be formed.

The passivation film 160 is formed on the gate insulation layer 130 to cover the data lines 140, the source electrodes S and the drain electrodes D, and then the organic insulation layer 170 having the second contact holes 172 is formed on the passivation film 160.

The first contact holes 162 are formed by etching a portion of the passivation film 160 using the organic insulation layer 170 as a mask. Thus, the first and second contact holes 162 and 172 expose a portion of the drain electrodes D of the TFTs.

The pixel electrodes 180 are formed on the organic insulation layer 170. The pixel electrodes 180 are formed on the pixel units respectively and are electrically connected to a portion of the drain electrodes D through the first and second contact holes 162 and 172.

According to the present invention as described above, air gaps are formed between gate lines and data lines at intersecting portions between the gate lines and the data lines, respectively. Because the air gaps have the lowest dielectric constant, that is, 1, the overlap capacitance that is generated between the gate lines and the data lines may be decreased. Because the load of gate signals applied to the gate lines and data signals applied to the data lines may be decreased, a delay time of the display device may also be decreased.

Having described the embodiments of the present invention and its advantages, it is noted that various changes, substitutions and alterations can be made herein without departing from the spirit and scope of the invention as defined by appended claims.

What is claimed is:

1. A display substrate comprising:
   a base substrate;
   a gate line extending in a first direction on the base substrate;
   a gate insulation layer formed on the base substrate to cover the gate line;
   a data line extending in a second direction intersecting the gate line at an intersecting portion, wherein in the intersecting portion the data line is separated from the gate line by an air gap and the data line, in the intersecting portion, includes at least one etching hole extending to the air gap;

a thin-film transistor (TFT) electrically connected to the data and gate lines; and a pixel electrode electrically connected to the TFT.

2. The display substrate of claim 1, wherein the etching hole is substantially formed on the center of the intersecting portion between the data line and the gate line.

3. The display substrate of claim 1, wherein the air gap is formed between the data line and a portion of the gate line exposed by the gate insulation layer.

4. The display substrate of claim 1, wherein the air gap is formed between the data line and the gate insulation layer.

5. The display substrate of claim 1, wherein the intersecting portion formed between the data line and the air gap includes an insulation pattern.

6. The display substrate of claim 5, wherein the insulation pattern of the intersecting portion is formed from a semiconductor pattern of the TFT.

7. The display substrate of claim 1, further comprising a passivation film formed on the gate insulation layer to cover the data line and the TFT and to expose a portion of the data line corresponding to the air gap.

8. The display substrate of claim 7, further comprising an organic insulation layer formed on the passivation film to expose the portion of the data line exposed by the passivation film.

9. A display device comprising:

a first substrate including:
 a base substrate;
 a gate line extending in a first direction on the base substrate;
 a gate insulation layer formed on the base substrate to cover the gate line;
 a data line extending in a second direction intersecting the gate line at an intersecting portion, wherein in the intersecting portion the data line is separated from the gate line by an air gap and wherein the data line, in the intersecting portion, includes at least one etching hole extending to the air gap;
 a TFT electrically connected to the data and gate lines; and
 a pixel electrode electrically connected to the TFT;

a second substrate facing the first substrate; and a liquid crystal layer between the first substrate and the second substrate.

* * * * *